(12) United States Patent
Yasuoka et al.

(10) Patent No.: US 6,906,308 B2
(45) Date of Patent: Jun. 14, 2005

(54) SEMICONDUCTOR LIGHT RECEIVING DEVICE IN WHICH OPTICAL AND ELECTRIC SIGNAL ARE PROPAGATED AT MATCHED VELOCITIES

(75) Inventors: Nami Yasuoka, Kawasaki (JP); Haruhisa Soda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 87 days.

(21) Appl. No.: 10/106,188

(22) Filed: Mar. 27, 2002

(65) Prior Publication Data

US 2003/0098408 A1 May 29, 2003

(30) Foreign Application Priority Data

Nov. 29, 2001 (JP) ........................................ 2001-364665

(51) Int. Cl.[7] ................................................. G01J 5/08
(52) U.S. Cl. ............................. 250/227.11; 250/208.2; 385/2; 385/14
(58) Field of Search ............................. 385/14, 2, 122; 250/208.2, 214.1, 227.11; 257/184

(56) References Cited

U.S. PATENT DOCUMENTS

| | | | |
|---|---|---|---|
| 5,054,871 A | * 10/1991 | Deri et al. | ...................... 385/30 |
| 5,270,532 A | 12/1993 | Hietala et al. | |
| 5,404,006 A | * 4/1995 | Schaffner et al. | ......... 250/208.2 |
| 5,572,014 A | 11/1996 | Wu et al. | |
| 5,933,562 A | * 8/1999 | Dutting et al. | ............... 385/131 |
| 6,310,700 B1 | * 10/2001 | Betts | .............................. 359/2 |
| 6,528,776 B1 | * 3/2003 | Marsland | .................. 250/208.2 |

FOREIGN PATENT DOCUMENTS

JP 2001-127333 5/2001

OTHER PUBLICATIONS

N. Yasuoka, et al., CPT2001 Technical Digest, (2001), pp. 105.
Kirk S. Giboney, published in IEEE Trans. On Microwave Theory and Techiniques, vol. 45, No. 8 (1997), pp. 1310–1319.
M.S. Islam et al. published in Microwave Photonics Technical Digest 2000, Oxford, UK, pp. 217.
T. Chau et al. published In IEEE Photonics Technology Letters, vol. 12, No. 8 (2000), pp. 1055–1057.

* cited by examiner

*Primary Examiner*—Thanh X. Luu
*Assistant Examiner*—Stephen Yam
(74) *Attorney, Agent, or Firm*—Armstrong, Kratz, Quintos, Hanson & Brooks, LLP.

(57) ABSTRACT

A plurality of semiconductor devices are disposed in a line on the surface of a supporting substrate. Each semiconductor device is adapted to generate an electric signal depending on the intensity of incident light. Adjacent semiconductor devices are optically coupled by an interconnecting optical waveguide so that light can pass through the semiconductor device one by one in a direction from a first stage closest to an input end to a last stage. An electric signal transmission line is formed of a pair of conductors connected to the semiconductor devices so that the electric signal generated by the semiconductor devices can propagate. One conductor of the pair of conductors of the electric signal transmission line is formed so as to extend in the air above the supporting substrate between adjacent semiconductor devices.

21 Claims, 18 Drawing Sheets

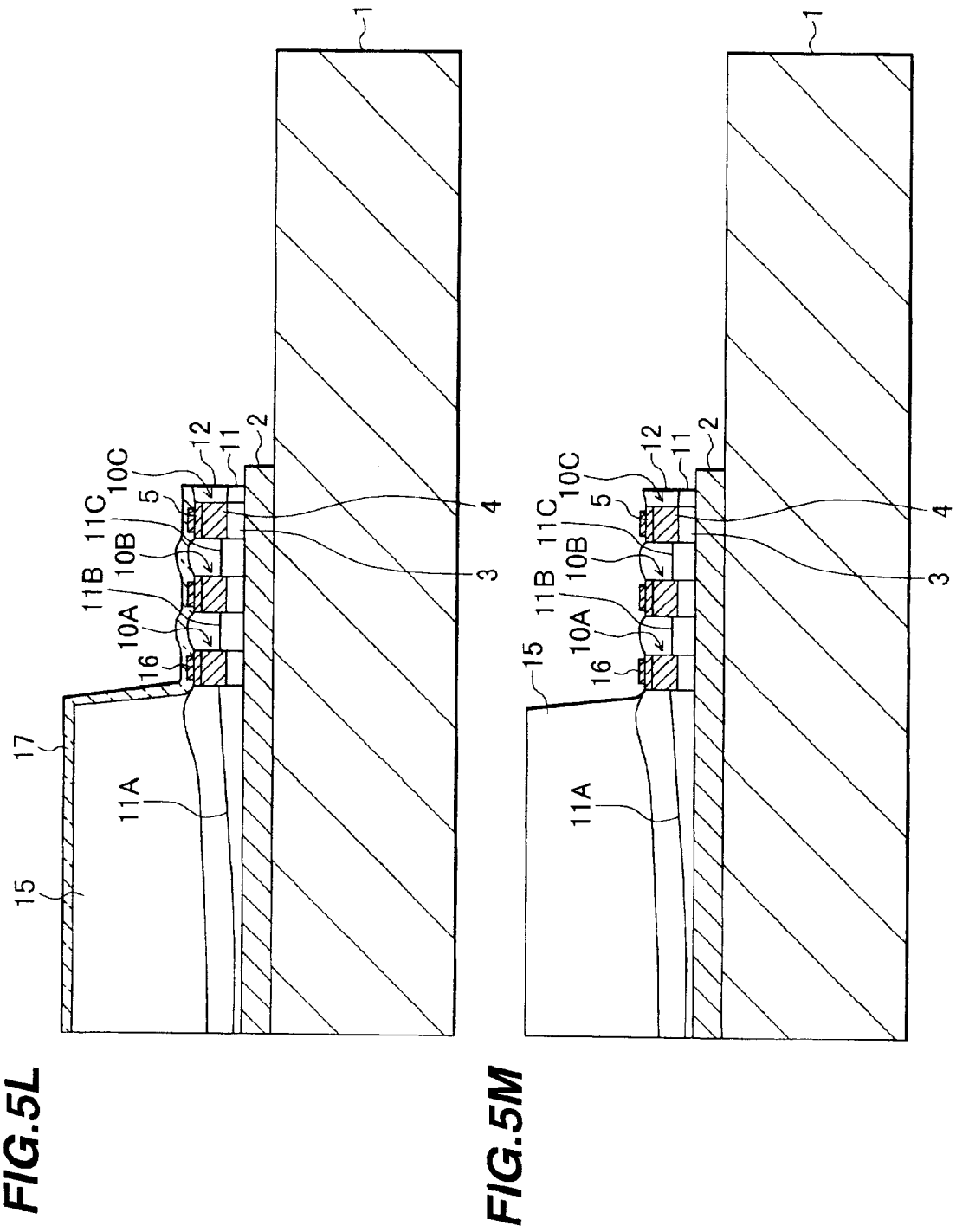

US 6,906,308 B2

SEMICONDUCTOR LIGHT RECEIVING DEVICE IN WHICH OPTICAL AND ELECTRIC SIGNAL ARE PROPAGATED AT MATCHED VELOCITIES

CROSS REFERENCE TO RELATED APPLICATION

This invention is based on and claims priority of Japanese patent application 2001-364665, filed on Nov. 29, 2001, the whole contents of which are incorporated herein by reference.

BACKGROUND OF THE INVENTION

1. Field of the Invention

The present invention relates to a semiconductor light receiving device, and more particularly, to a semiconductor light receiving device for use in a broadband optical communication system. Advances in the Internet have produced a need, becoming increasingly greater, for a high-speed optical communication system. In optical communication systems, an information transmission rate higher than 40 Gbits/s is required. To meet this requirement, a semiconductor light receiving device capable of operating at a sufficiently high speed is needed.

2. Description of the Related Art

FIG. 10A is a perspective view of a semiconductor light receiving device according to a first conventional technique disclosed in Japanese Unexamined Patent Application Publication No. 2001-127333, and FIG. 10B is a cross-sectional view thereof. A tapered optical waveguide 501 is formed on the surface of a semi-insulating InP substrate 500. A pin photodiode 502, which is buried in an InP region, is coupled with an output end of the tapered optical waveguide 501. The pin photodiode 502 is connected to an n-side electrode 505 and a p-side electrode 506. The thickness of the tapered optical waveguide 501 gradually increases in a direction from its input end toward its output end.

An optical signal inputted into the tapered optical waveguide 501 through its input end travels along the tapered optical waveguide 501 to the photodiode 502. When the photodiode 502 receives the optical signal, the photodiode 502 converts the input optical signal into an electric signal. The resultant electric signal is outputted to the electrodes 505 and 506.

This semiconductor light receiving device using the tapered optical waveguide has as high response performance as capable of operating at 40 GHz. Using this semiconductor light receiving device, an apparatus having high-efficiency performance regardless of polarization has been achieved (N. Yasuda, et at. CPT2001 Technical Digest, (2001), pp. 105).

FIG. 11A is a plan view of a traveling-wave light receiving device according to a second conventional technique disclosed in U.S. Pat. No. 5,270,532 and also in a paper by Kirk S. Giboney published in IEEE Trans. on Microwave Theory and Techniques, Vol. 45, No. 8 (1997), pp. 1310–1319. FIGS. 11B and 11C are cross-sectional views taken along one-dot-chain-line B11—B11 and one-dot-chain line C11—C11, respectively, of FIG. 11A.

A multilayer structure comprising an n-type semiconductor layer 520 located at the bottom, a light receiving layer 511 made of an intrinsic semiconductor located in a middle layer, and a p-type semiconductor layer 521 located at the top is disposed on the surface of a semi-insulating semiconductor substrate 510. This multilayer structure extends along a single straight line. A center electrode 512 is disposed on the surface of the p-type semiconductor layer 521. A ground electrode 513 formed on the surface of the semiconductor substrate 510 is connected to the n-type semiconductor layer 520.

The multilayer structure consisting of the three layers, that is, the n-type semiconductor layer 520, the light receiving layer 511, and the p-type semiconductor layer 521, forms an optical waveguide-type light receiving element. The ground electrode 513 and the center electrode 512 form an electric signal transmission line extending in parallel with the optical waveguide-type light receiving element. An optical signal is inputted to the light receiving layer 511 through its input end. A ground pad 523 is connected to the output end of the ground electrode 513. An output pad 524 is connected to the output end of the center electrode 512.

An optical signal is inputted into an optical waveguide formed by the light receiving layer 511 through its input end, and the optical signal propagates inside the optical waveguide. The propagation of the optical signal causes an electric signal to be generated between the n-type semiconductor layer 520 and the p-type semiconductor layer 521, and the generated electric signal propagates along the electric signal transmission line consisting of the ground electrode 513 and the center electrode 512. A high quantum efficiency can be achieved over a wide band by matching the propagation velocity of the optical signal with the propagation velocity of the electric signal.

FIG. 12A is a perspective view of a velocity-matched traveling-wave light receiving device according to a third conventional technique disclosed in a paper by M. S. Islam et al. published in Microwave Photonics Technical Digest 2000, Oxford, UK, pp. 217, a paper by T. Chau et al. published in IEEE Photonics Technology Letters, Vol. 12, No. 8 (2000), pp. 1055–1057, and in U.S. Pat. No. 5,572,014. FIG. 12B is a side view thereof, and FIG. 12C is a cross-sectional view taken along a plane vertical to a light propagation direction.

An optical waveguide 531 is formed on a semi-insulating semiconductor substrate 530. On the upper surface of the optical waveguide 531, a plurality of photodiodes 532, spaced apart from each other, are disposed along the light propagation direction. Each photodiode 532 is coupled, in an evanescent coupling, with the optical waveguide 531. An electrically conductive film 533 is disposed at one side of the optical waveguide 531 and an electrically conductive film 534 is disposed at the opposite side. The electrically conductive films 533 and 534 form an electric signal transmission line. One electrode of each photodiode 532 is connected to the electrically conductive film 533, and the other electrode is connected to the electrically conductive film 534.

An optical signal propagating through the optical waveguide 531 causes the photodiodes 532 to generate an electric signal. The generated electric signal propagates through the electric signal transmission line consisting of the electrically conductive films 533 and 534. In this light receiving device, the propagation velocity of the optical signal is matched with the propagation velocity of the electric signal so as to achieve high performance to respond a signal at a very high frequency such as several ten GHz.

In the first conventional technique shown in FIGS. 10A and 10B, it is required that the capacitance of the photodiode 502 should be as small as possible to achieve a high speed operation. The capacitance can be reduced by reducing the length of the photodiode 502 in the direction in which light propagates.

FIG. 13A shows the dependence of the capacitance on the length of the photodiode 502. In FIG. 13A, the horizontal axis represents the length of the photodiode 502 in units of μm, and the vertical axis represents the capacitance in units of fF. Herein, the photodiode 502 has a width of 4 μm. As can be seen, the capacitance decreases with decreasing length of the photodiode 502. When the length of the photodiode 502 is 3 μm, the capacitance becomes about 15 fF. When an electric circuit at the following stage connected to the photodiode 502 has an input impedance of 50 Ω, the cutoff frequency determined by a CR time constant becomes as high as 300 GHz, and thus a very high-speed operation is possible.

However, the reduction in length of the photodiode 502 results in a reduction in the absorption of light.

FIG. 13B shows the dependence of the internal quantum efficiency on the length of the photodiode 502. In FIG. 13B, the horizontal axis represents the length of the photodiode 502 in units of μm, and the vertical axis represents the internal quantum efficiency in units of %. As can be seen, the reduction in the length of the photodiode 502 results in a reduction in internal quantum efficiency. Thus, with the first conventional light receiving device, it is difficult to achieve both a high-speed operation and a high efficiency at the same time.

In the second conventional light receiving device shown in FIGS. 11A to 11C, a high-speed operation can be achieved regardless of the capacitance between the n-type semiconductor layer 520 and the p-type semiconductor layer 521. It is desirable that the characteristic impedance of the optical waveguide-type light receiving element be adjusted to 50 Ω so as to match the input impedance of an electric circuit at the following stage connected to this semiconductor light receiving device. In the case where the thickness of the light receiving layer 511 is about 0.2 μm, if the width of the optical waveguide-type light receiving element is adjusted to be about 1 μm, the characteristic impedance of the electric signal transmission line becomes equal to 50 Ω. However, if the width of the optical waveguide-type light receiving element is set to be so small, it becomes difficult to form the center electrode 512 on the upper surface of the optical waveguide-type light receiving element.

In the third conventional light receiving device shown in FIGS. 12A to 12C, not only the characteristic impedance of the electric signal transmission line is adjusted to be 50 Ω, but also other various parameters should be adjusted. Furthermore, in order to match the propagation velocity of the electric signal with the propagation velocity of the optical signal, it is required to adjust the distance of two adjacent photodiode 532 to about 0.15 mm. In the case where 10 photodiodes 532 are disposed to achieve a high quantum efficiency, the length of the light receiving device becomes as great as 1.5 mm or greater.

SUMMARY OF THE INVENTION

It is an object of the present invention to provide a small-sized wide-band semiconductor light receiving device having a high quantum efficiency.

According to one aspect of the present invention, there is provided a semiconductor light receiving device comprising: a plurality of semiconductor devices, which are disposed in a line on a surface of a supporting substrate and each of which is adapted to generate an electric signal depending on the intensity of incident light; an interconnecting optical waveguide formed such that the plurality of semiconductor devices are coupled by the interconnecting optical waveguide from one semiconductor device to an adjacent one so as to allow light to pass through the semiconductor devices from one semiconductor device to an adjacent one in a direction from the first stage toward the last stage; and an electric signal transmission line formed by a pair of conductors connected to the semiconductor devices, for transmitting an electric signal generated by the semiconductor devices, a first conductor of the pair of conductors extending in the air above the supporting substrate between adjacent semiconductor devices.

When an optical signal passes through the semiconductor device from one to another, an electric signal is generated by the semiconductor devices and transmitted along the electric signal transmission line. Forming the first conductor so as to extend in the air makes it possible to adjust the inductance of the first conductor such that the propagation velocity of the electric signal is matched with the propagation velocity of the optical signal and such that impedance matching between the electric signal transmission line and an electric circuit at a following stage is achieved.

According to another aspect of the present invention, there is provided a semiconductor light receiving device comprising: a first conductive layer formed of a semiconductor having a first conduction type on the surface of a supporting substrate; a plurality of multilayer structures disposed in a line on the surface of the first conductive layer, each multilayer structure including a multilayer structure comprising a light receiving layer and a second conductive layer formed of a semiconductor having a second conduction type opposite to the first conduction type, each multilayer structure being adapted to generate an electric signal between the first conductive layer and the second conductive layer in response to an optical signal incident on the light receiving layer, an interconnecting optical waveguide disposed on the first conductive layer so as to optically connect light receiving layers of adjacent multilayer structures with each other; and a conductive thin wire disposed so as to connect the second conductive layers of the multilayer structures from one to another thereby allowing the generated electric signal to be transmitted.

The three layers, that is, the first conductive layer, the light receiving layer, and the second conductive layer, form a photodiode. An electric signal generated by the photodiode is transmitted through the conductive thin wire.

According to still another aspect of the present invention, there is provided a semiconductor light receiving device comprising: a plurality of semiconductor devices, which are disposed in a line on a surface of a supporting substrate and each of which is adapted to generate an electric signal depending on the intensity of incident light; an interconnecting optical waveguide formed such that the plurality of semiconductor devices are coupled by the interconnecting optical waveguide from one semiconductor device to an adjacent one so as to allow light to pass through the semiconductor devices from one semiconductor device to an adjacent one in a direction from the first stage toward the last stage, the interconnecting optical waveguide being butt-coupled with the semiconductor devices; and an electric signal transmission line formed by a pair of conductors connected to the semiconductor devices, for transmitting an electric signal generated by the semiconductor devices.

The butt-coupled structure used herein allows an increase in the optical coupling efficiency.

The semiconductor devices are connected from one to another using the conductive thin wire having inductance selected such that the transmission line formed by the conductive thin wire has a characteristic impedance equal to 50 Ω, thereby achieving impedance matching with the electric circuit at the following stage. The propagation velocity of the electric signal propagating through the transmission line is matched with the propagation velocity of the optical signal propagating through the semiconductor devices disposed in a line from one to another, thereby achieving a high optical-to-electric conversion efficiency even at very high frequencies.

DESCRIPTION OF THE PREFERRED EMBODIMENTS

Figure 1A:
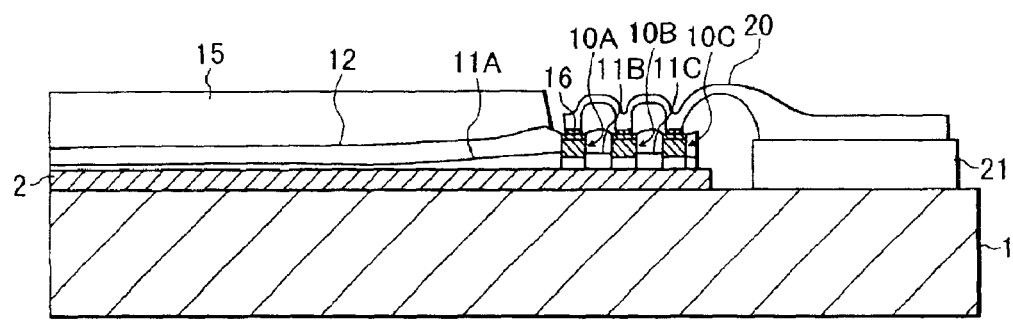
FIG. 1A is a cross-sectional view of a semiconductor light receiving device according to a first embodiment.
Figure 1B:
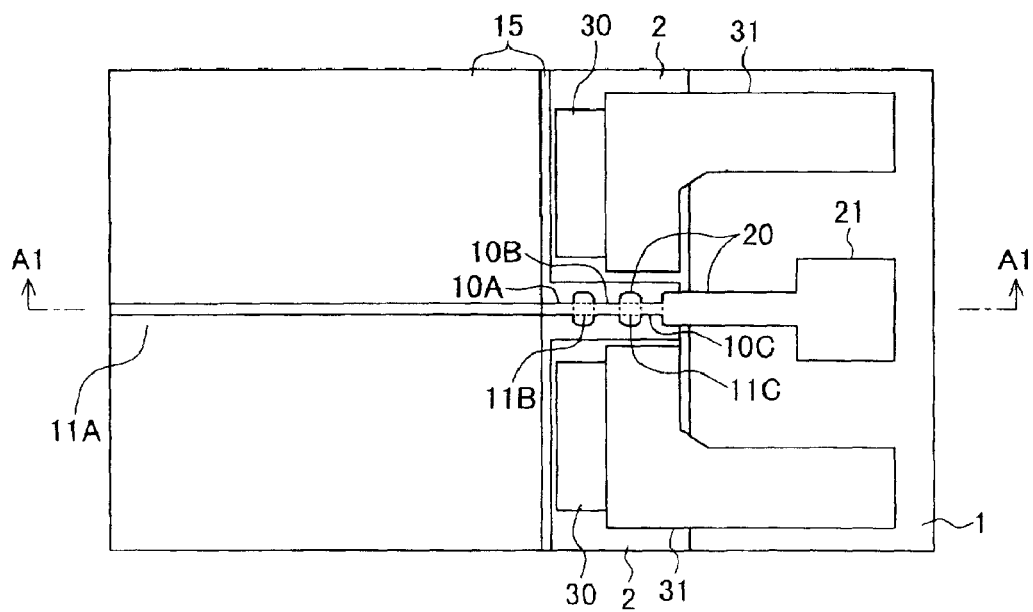
FIG. 1B is a plan view thereof.

FIGS. 1A and 1B are a cross-sectional view and a plan view of a semiconductor light receiving device according to a first embodiment of the present invention, wherein the cross-sectional view shown in FIG. 1A is taken along a line A1—A1 of FIG. 1B.

As shown in FIG. 1A, an n-type layer 2 made of $n^+$-type InP with a thickness of about 2 μm is formed in a partial area of the surface of a semiconductor substrate 1 made of semi-insulating InP. In FIG. 1B, ⅔ of the surface, on the left-hand side, of the semiconductor substrate 1 is covered with the n-type layer 2.

On the n-type layer 2, a first-stage multilayer structure 10A, a second-stage multilayer structure 10B, and a third-stage multilayer structure 10C are disposed in a line from left to right in FIG. 1. One photodiode is formed by the n-type layer 2 and one of multilayer structures 10A to 10C. Thus, hereinafter, each of the multilayer structures 10A to 10C will be called a photodiode. Each photodiode 10A to 10C has a three-layer structure including a light receiving layer, a p-type layer, and a cap layer, as will be described in detail later with reference to FIG. 2.

A tapered optical waveguide 11A extends from the first-stage photodiode 10A to left in FIG. 1B. The thickness of the tapered optical waveguide 11A gradually increases toward the first-stage photodiode 10A. An interconnecting optical waveguide 11B is disposed between the first-stage photodiode 10A and the second-stage photodiode 10B, and an interconnecting optical waveguide 11C is disposed between the second-stage photodiode 10B and the third-stage photodiode 10C. The tapered optical waveguide 11A and the interconnecting optical waveguides 11B and 11C are made of undoped InGaAsP.

A clad layer 12 formed of undoped InP is disposed on the tapered optical waveguide 11A and the interconnecting optical waveguides 11B and 11C. The tapered optical waveguide 11A, the light receiving layer of the first-stage photodiode 10A, the interconnecting optical waveguide 11B, the light receiving layer of the second-stage photodiode 10B, the interconnecting optical waveguide 11C, and the light receiving layer of the third-stage photodiode 10C are butt-coupled from one to another so as to form an optical waveguide.

The upper surfaces and the side faces of the tapered optical waveguide 11A and the interconnecting optical waveguides 11B and 11C are covered with a clad layer 15 formed of a Fe-doped semi-insulating InP. A contact layer 16 having a three-layer structure of Au/Zn/Au is formed on the upper surface of each photodiode 10A to 10C. The contact layers 16 on the photodiodes 10A to 10C are connected from one to another by a conductive thin wire 20. An end of the conductive thin wire 20 is connected to a pad 21 formed on the surface of the semiconductor substrate 1.

As shown in FIG. 1B. A contact layer 30 are formed in areas, where the n-type layer 2 is exposed, at both sides (upper and lower sides in FIG. 1B) of the line of optical-to-electric converter formed by the photodiodes 10A to 10C. The contact layer 30 has a two-layer structure formed by a AuGe layer and a Au layer and is ohomically connected to the n-type layer 2. A coplanar electrode 31 formed on the surface of the semiconductor substrate 1 is connected to the contact layer 30.

Figure 2:
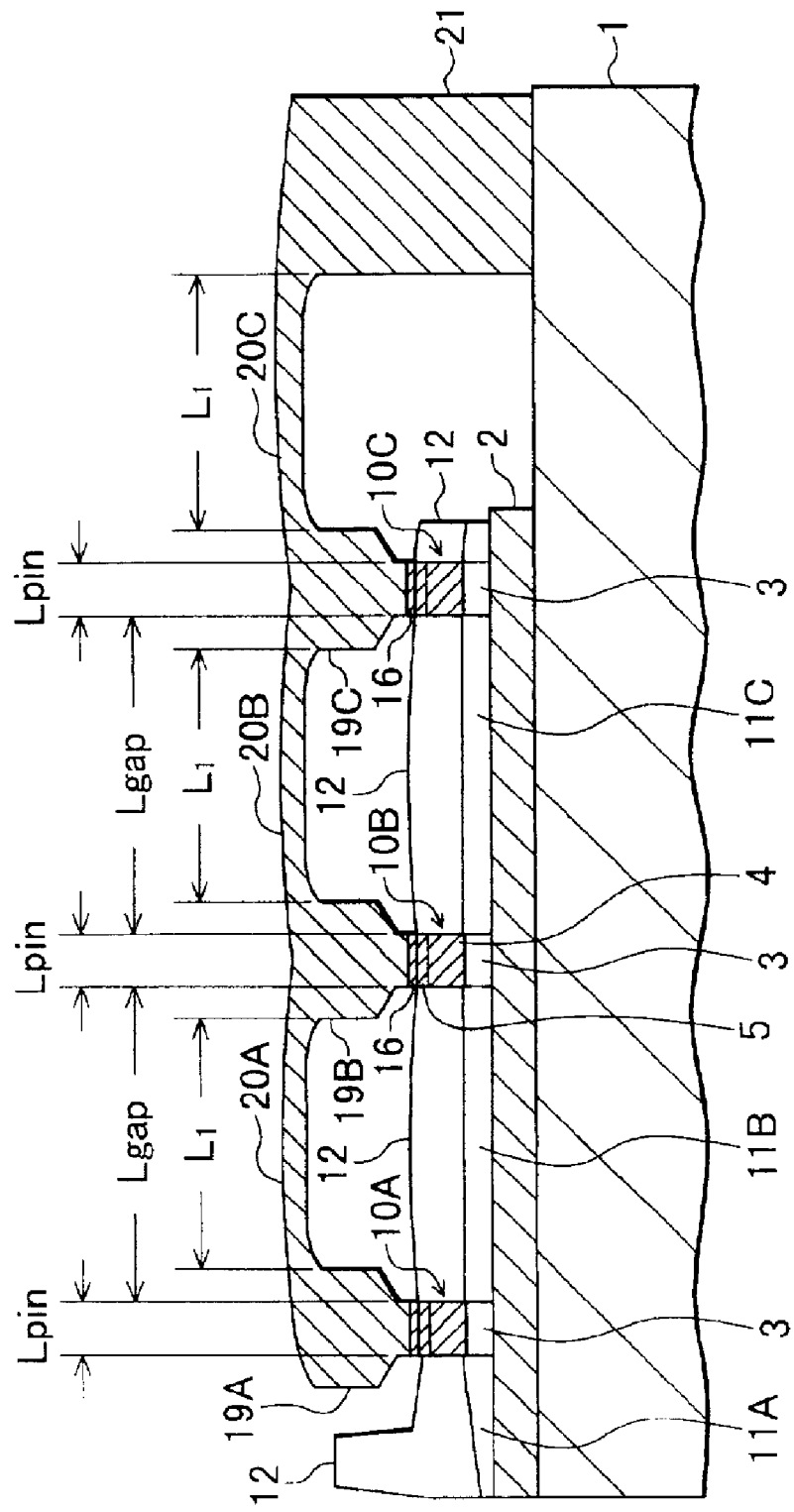
FIG. 2 is a cross-sectional view of an optical-to-electric converter of the semiconductor light receiving device according to the first embodiment.

FIG. 2 is a cross-sectional view illustrating the details of the optical-to-electric converter shown in FIG. 1A. Each of the photodiodes 10A to 10C has a three-layer structure including a light receiving layer 3 formed of undoped InGaAs with a thickness of 0.06 to 0.3 μm, a p-type layer 4 formed of p-type InP with a thickness of about 2 μm, and a cap layer 5 formed of p-type InGaAs with a thickness of 0.05 μm, disposed in this order. A contact layer 16 is formed on the p-type layer 5 of each photodiode 10A to 10C.

Conductive elements 19A to 19C are disposed on the respective contact layers 16 of the first to third-stage photodiodes 10A to 10C such that conductive elements 19A to 19C are ohmically connected to the respective contact layers 16. The conductive element 19A at the first stage and the conductive element 19B at the second stage are connected to each other by a conductive thin wire 20A. The conductive element 19B at the second stage and the conductive element 19C at the third stage are connected to each other by a conductive thin wire 20B. The conductive element 19C at the third stage and the pad 21 are connected to each other by a conductive thin wire 20C. The conductive thin wires 20A to 20C are formed so as to extend in the air above the semiconductor substrate 1. The conductive thin wires 20A to 20C and the n-type layer 2 form an electric signal transmission line.

From the tapered optical waveguide 11A, an optical signal is input to the light receiving layer 3 of the first-stage photodiode 10A. After passing through the light receiving layer 3 of the first-stage photodiode 10A, the optical signal further passes through the interconnecting optical waveguide 11B, the light receiving layer 3 of the second-stage photodiode 10B, the interconnecting optical waveguide 11C, and the light receiving layer 3 of the third-stage photodiode 10C, from one to another. When the optical signal passes through the light receiving layers 3 of the photodiodes 10A to 10C, part of the optical signal is converted into an electric signal.

The electric signal generated by the first-stage photodiode 10A propagates through the conductive thin wire 11A and joins with the electric signals generated by the photodiodes 10B and 10C at the second and third stages. The resultant electric signal further propagates until reaching the pad 21. By matching the propagation velocity of the optical signal traveling along the interconnecting optical waveguides 11B and 11C with the propagation velocity of the electric signal traveling along the conductive thin wires 11A and 11B, a high conversion efficiency can be achieved.

Figure 3:
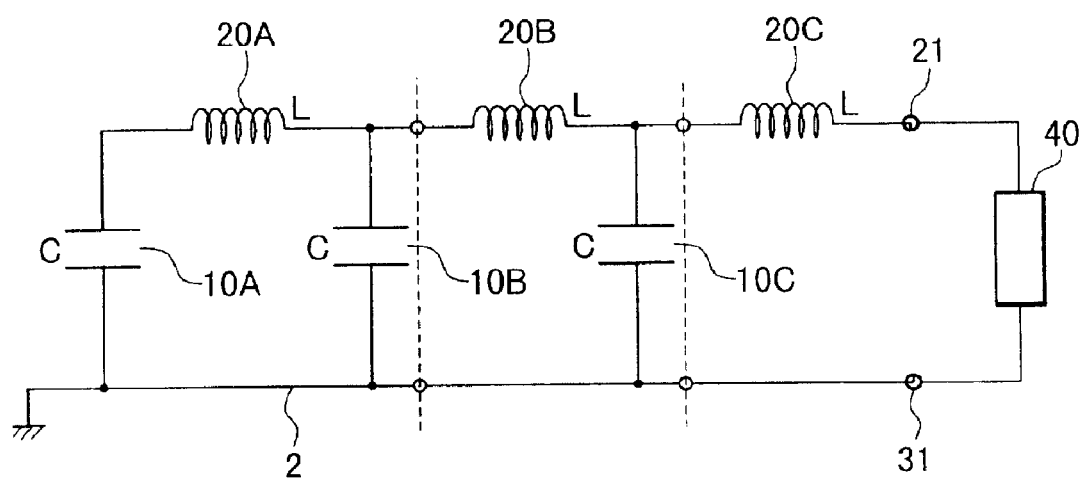
FIG. 3 is an equivalent circuit of the optical-to-electric converter of the semiconductor light receiving device according to the first embodiment.

FIG. 3 is an equivalent circuit of the semiconductor light receiving device according to the first embodiment. The thee photodiodes 10A to 10C are represented by capacitors C, the conductive thin wires 11A to 11C are represented by inductors L, and the n-type layer 2 is represented by a single interconnection line. In general, an electric circuit 40 having an input impedance of 50 Ω at a following stage is connected between the pads 21 and 31. To connect such an electric circuit, it is desirable that the electric signal transmission line formed by the capacitors C and the inductors L be designed to have a characteristic impedance of 50Ω.

This electric signal transmission line can be regarded as a transmission line formed by cascading several unit segments (three unit segments, in this first embodiment) each consisting of one photodiode and one conductive thin wire. The length of the unit segment is at most 100 μm. Therefore, if the frequency of the electric signal being propagated is assumed to be 80 to 160 GHz, each the unit segment can be regarded as a lumped-constant circuit.

The characteristic impedance of a transmission line is discussed below. If the characteristic impedance of the transmission line shown in FIG. 3 is denoted by Z, and the angular frequency of the electric signal is denoted by ω, then the characteristic impedance Z is given by $$Z = i\omega L/2 + (L/C - \omega^2 L^2/4)^{1/2} \quad (1)$$

Within the operating frequency region, the second term in an expression of a square root of the real part of equation (1) can be neglected. Therefore, the characteristic impedance can be approximated as $(L/C)^{1/2}$. Therefore, if $$(L/C)^{1/2} = 50 \quad (2)$$

is satisfied, attenuation and reflection of the high-frequency electric signal are suppressed, and the electric signal is efficiently transmitted to the electric circuit at the following stage.

The matching between the propagation velocity of the optical signal and the propagation velocity of the electric signal is discussed below.

The time T1 needed for the optical signal to propagate through the interconnecting optical waveguide 11B or 11C shown in FIG. 2 is given by $$T1 = (n_{eff}/C_o)(L_{pin} + L_{gap}) \quad (3)$$

where $n_{eff}$ denotes the effective refractive index of the interconnecting optical waveguides 11B and 11C, $c_o$ denotes the velocity of light in a vacuum, $L_{pin}$ denotes the length of each photodiode 10A to 10C, and $L_{gap}$ denotes the space between two adjacent photodiodes.

On the other hand, the time T2 needed for the generated electric signal to propagate through the conductive thin wire 11A or 11B is given by $$T2 = (L \cdot C)^{1/2} \quad (4)$$

In order to match the velocity of the optical signal and the velocity of the electric signal with each other, it is required that the times T1 and T2 should be equal to each other. That is, the following equation should be satisfied.

$$(L \cdot C)^{1/2} = (n_{eff}/c_o)(L_{pin} + L_{gap}) \quad (5)$$

In equation (5), the effective refractive index $n_{eff}$ is equal to 3.1704. If the width of each of the conductive thin wires 11A and 11B is selected to be 7 μm and the length $L_1$ thereof is selected to be 47 μm, the inductance L of the unit segment becomes 0.0345 nH. Furthermore, if the width of each of the photodiodes 10A to 10C is selected to be 4 μm, the length $L_{pin}$ thereof to 3 μm, and the thickness of the light receiving layer 3 to 0.15 μm, then the capacitance C of the unit segment becomes 0.015 fF. Thus, in this case, equation (2) is satisfied. Under the above conditions, if the space $L_{gap}$ between adjacent photodiodes is set to 55 μm, then equation (5) is satisfied.

The light detection sensitivity is discussed below. In the first embodiment, as described above, the plurality of photodiodes are connected by the interconnecting optical waveguide such that the optical signal passes through the photodiodes from one to another, thereby allowing part of light remaining without being absorbed by a photodiode to be effectively fed to a photodiode at a following stage. This makes it possible to improve the internal quantum efficiency.

The coupling loss between the interconnecting optical waveguide 11B and the photodiode 10A can be minimized by designing the interconnecting optical waveguide 11B and the photodiode 10A so as to maximize the overlap integral between the electric field distributing in the interconnecting optical waveguide 11B in width and thickness directions and the electric field distributing in the photodiode 10A in width and thickness directions. For example, when the wavelength of the optical signal is 1.55 μm, if the thickness of the interconnecting optical waveguide 11B is set to be 0.25 μm, the thickness of the light receiving layer 3 of the photodiode 10A is set to be 0.15 μm, and the interconnecting optical waveguide 11B and the photodiode 10A are butt-coupled, a coupling efficiency as high as about 98% can be achieved. Similarly, high coupling efficiencies can be achieved also for the other coupling interfaces between the interconnecting optical waveguide and the photodiodes and for the coupling interface between the tapered optical waveguide 11A and the photodiode 10A. This makes it possible to achieve a high conversion efficiency using a small number of photodiodes. The reduction in the number of photodiodes results in a reduction in the total apparatus size.

Figure 4:
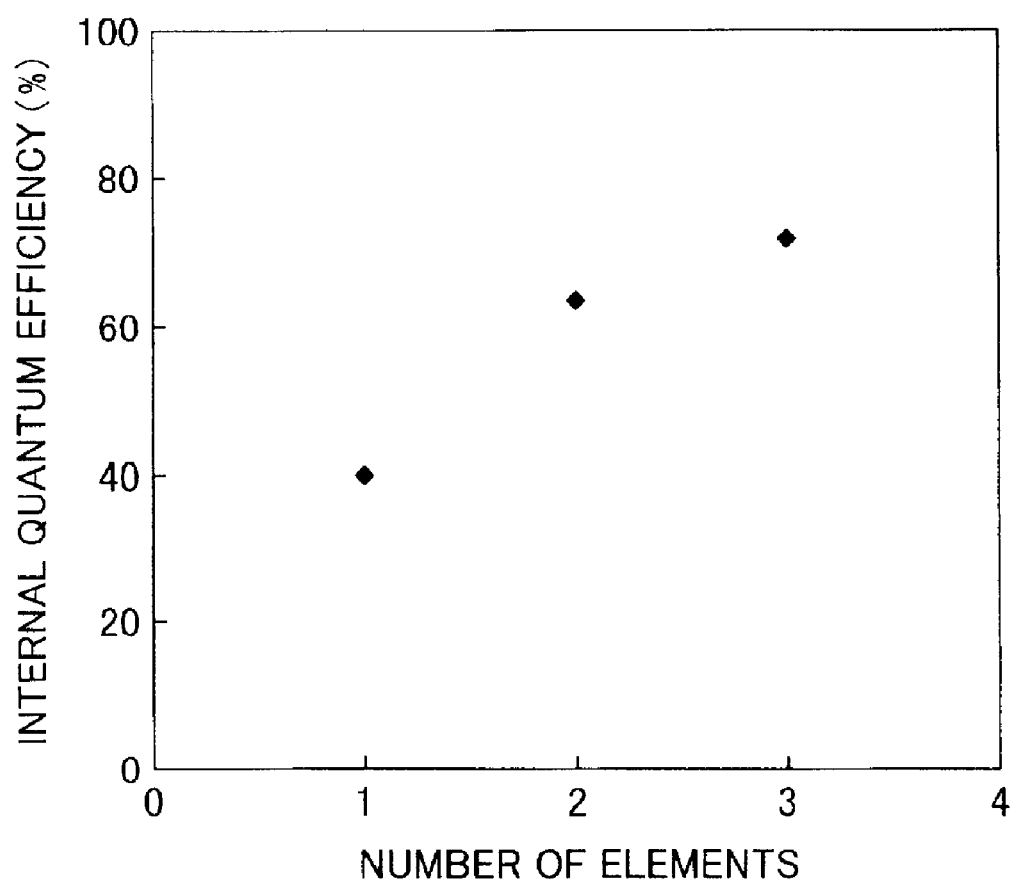
FIG. 4 is a graph showing the internal quantum efficiency of an optical-to-electrical converter.

FIG. 4 shows the dependence of the internal quantum efficiency on the number of photodiodes. In FIG. 4, the horizontal axis represents the number of photodiodes, and the vertical axis represents the internal quantum efficiency in units of %. As can be seen, although the internal quantum efficiency is about 40% when one photodiode is used, the internal quantum efficiency becomes as high as 70% if three photodiodes are used. With the structure according to the first embodiment, the calculated total coupling loss between the interconnecting optical waveguide and the photodiodes is as small as about 5%. As described above, the butt-coupling structure makes it possible to achieve a higher internal quantum efficiency using a small number of photodiodes than can be achieved by the evanescent coupling structure.

Figure 5A:
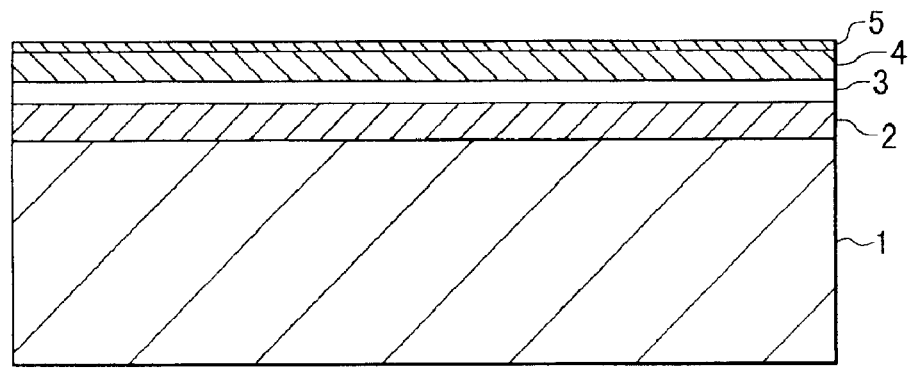
FIGS. 5A to 5N are cross-sectional views and plan views showing a method of producing the semiconductor light receiving device according to the first embodiment.
Figure 5B:
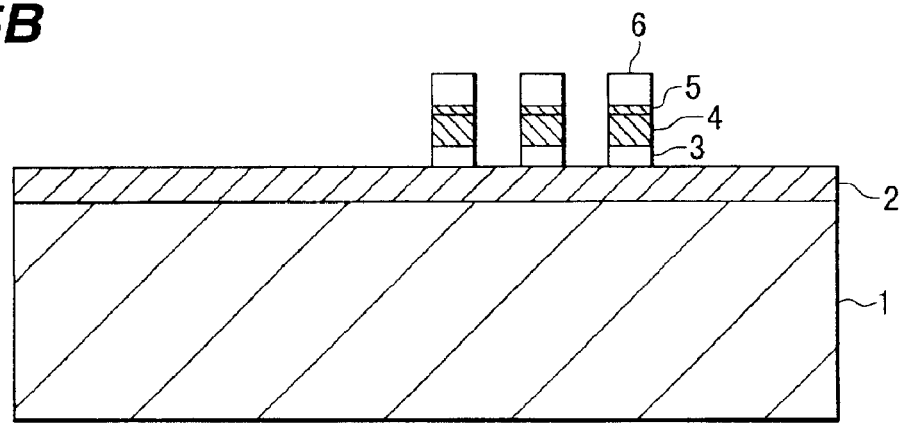
Figure 5C:
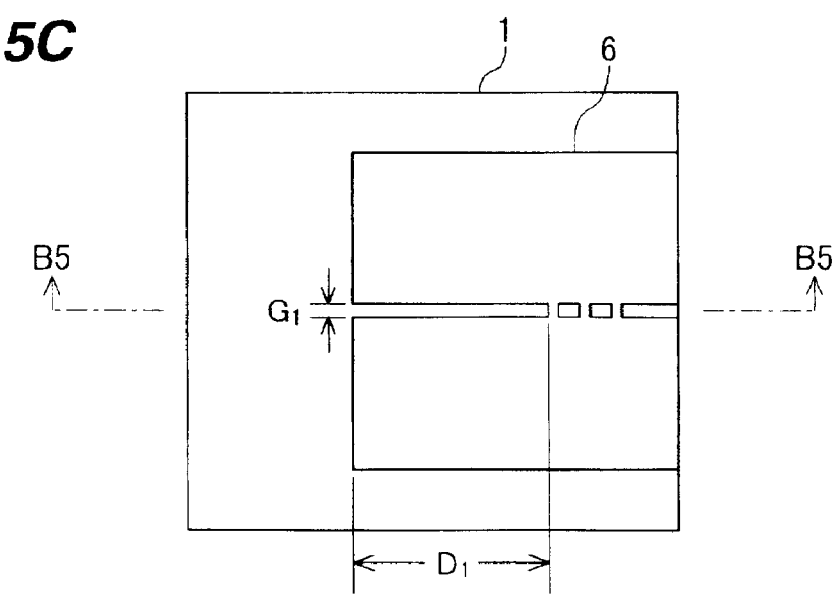
Figure 5D:
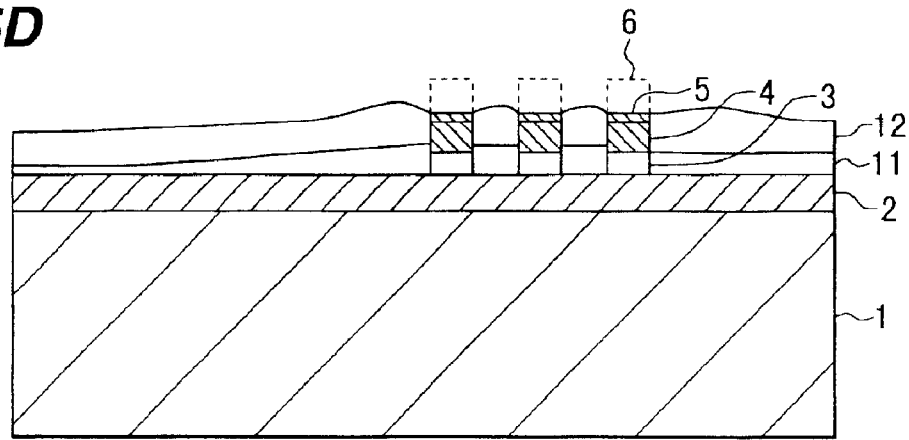
Figure 5E:
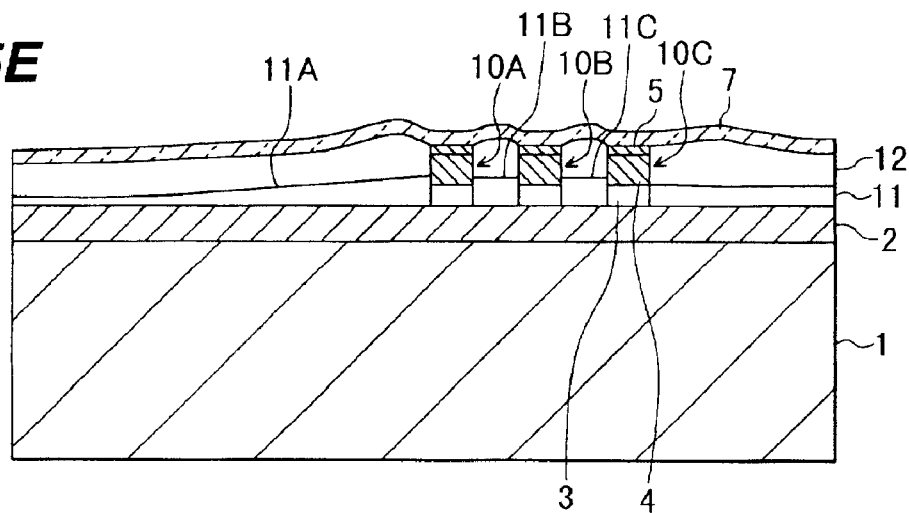
Figure 5F:
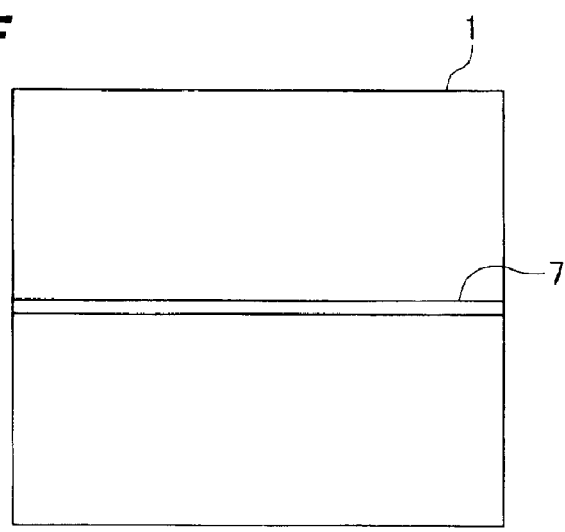
Figure 5G:
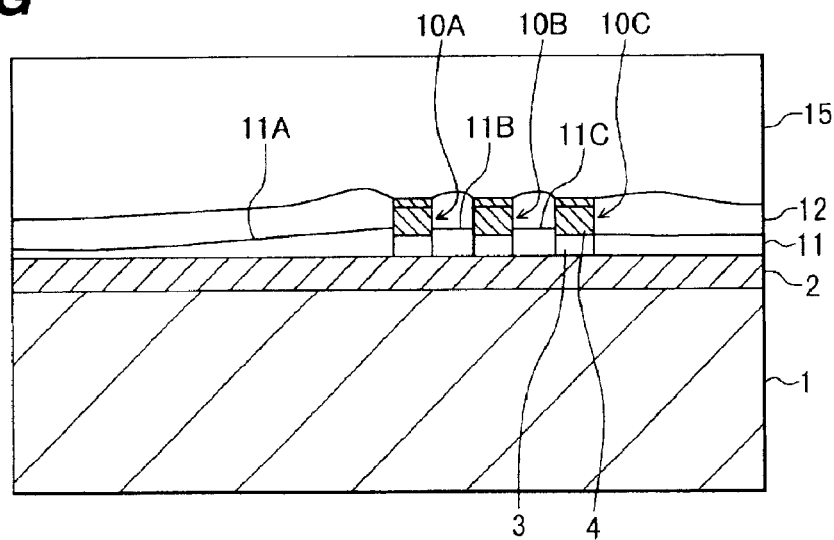
Figure 5H:
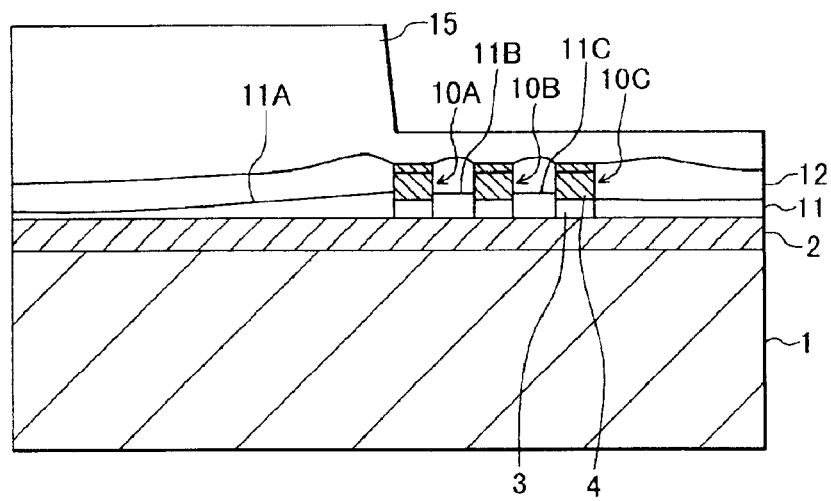
Figure 5I:
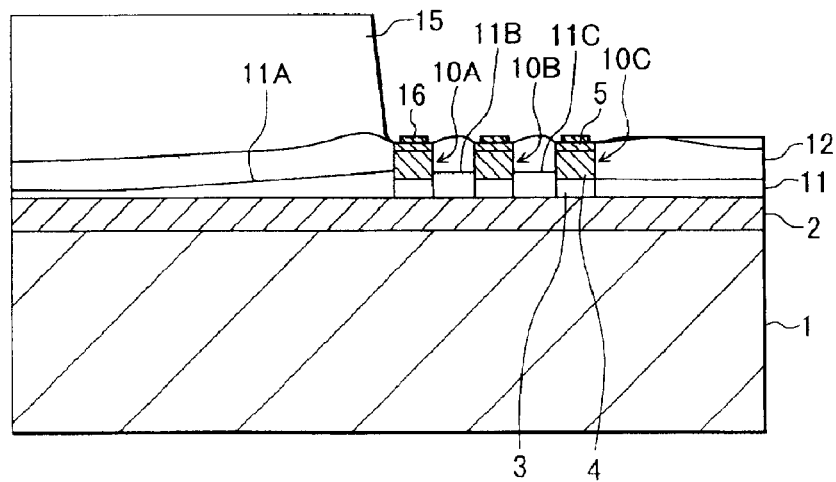
Figure 5J:
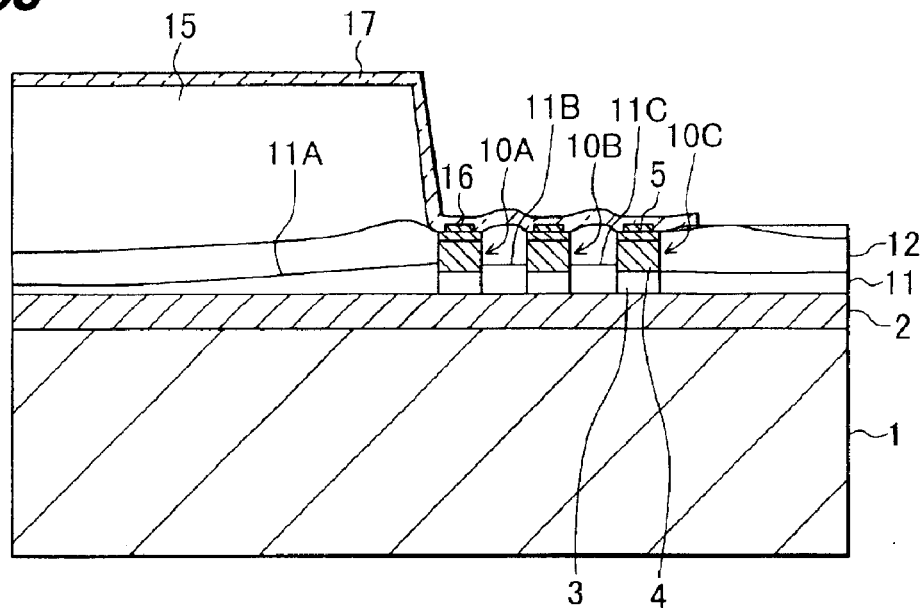
Figure 5K:
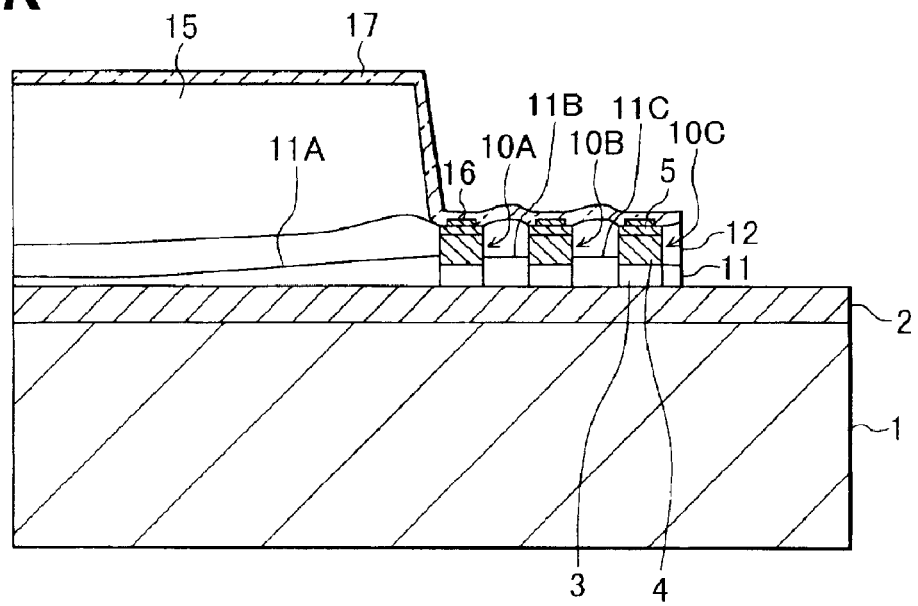
Figure 5N:
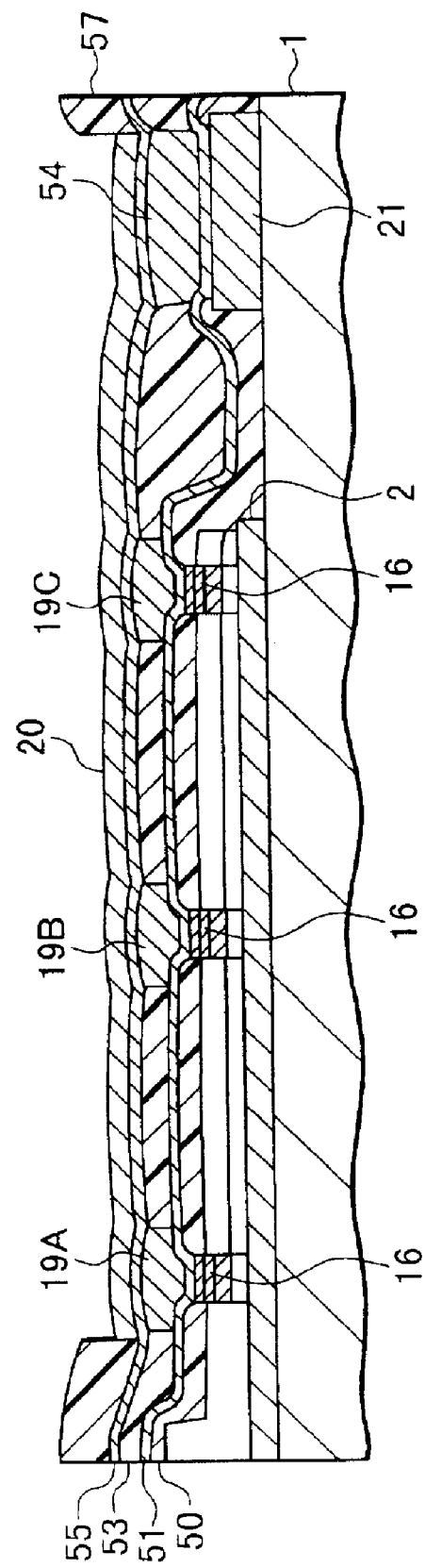

Referring to FIGS. 5A to 5N, a method of producing the semiconductor light receiving device according to the first embodiment is described below.

As shown in FIG. 5A, an n-type layer 2 of $n^+$-type InP with a thickness of about 2 μm, a light receiving layer 3 of undoped InGaAs with a thickness of 0.06 to 0.3 μm, a p-type layer 4 of p-type InP with a thickness of 2 μm, and a cap layer 5 of p-type InGaAs with a thickness of 0.05 μm are formed, in this order, on the surface of a semiconductor substrate 1 made of semi-insulating InP.

These films may be formed by means of, for example, metal organic chemical vapor deposition (MOCVD) at a growth temperature of 630° C. and at a pressure of $1.33\times10^4$ Pa (100 Torr). In this case, phosphine ($PH_3$), arsine ($AsH_3$), monosilane ($SiH_4$), trimethyl indium (TMI), and triethyl gallium (TEG) may be used as source gases.

Thereafter, as shown in FIG. 5B, the three layers from the cap layer 5 to the light receiving layer 3 are patterned using a mask pattern 6 formed of $SiO_2$ or the like. A multilayer structure composed of the light receiving layer 3, the p-type layer 4, and the cap layer 5 is formed in area covered with the mask pattern 6, and the n-type layer 2 is exposed in areas that are not covered with the mask pattern 6.

FIG. 5C is a plan view of the mask pattern 6, wherein FIG. 5B is a cross-sectional view taken along line B5—B5 of FIG. 5C. The mask pattern 6 is formed so as to cover, in FIG. 1B, areas at both sides of a part of the tapered optical waveguide 11A whose distance from the photodiode 10A is equal to or smaller than $D_1$ and area at both sides of a band-shaped area extending from the end of the tapered optical waveguide 11A in a direction toward the photodiode 10A. Furthermore, the mask pattern 6 also covers areas corresponding to the photodiodes 10A to 10C. The width $G_1$ of a band-shaped area that corresponds to the tapered optical waveguide 11A and that is not covered with the mask pattern 6 is set to be slightly greater than the width of the tapered optical waveguide 11A to be produced.

Thereafter, as shown in FIG. 5D, an optical waveguide layer 11 of undoped InGaAsP and a clad layer 12 of undoped InP are selectively grown by means of MOCVD on the surface of the n-type layer 2. The optical waveguide layer 11 and the clad layer 12 are not grown on the mask pattern 6. The film growth may be performed, for example, at a growth temperature of 630° C. and at a pressure of $1.33\times10^4$ Pa (100 Torr), using phosphine, arsine, monosilane, trimethyl indium, and triethyl gallium as source gases. By forming the mask pattern 6 so as to have a shape such as that shown in FIG. 5C, it becomes possible to form the optical waveguide layer 11 such that the thickness thereof gradually decreases in a direction from the leftmost multilayer structure to left in FIG. 5D. After completion of the selective growth, the mask pattern 6 is removed.

Thereafter, as shown in FIG. 5E, a mask pattern 7 of SiN is formed on the clad layer 12.

FIG. 5F is a plan view of the mask pattern 7. The tapered optical waveguide 11A shown in FIG. 1B and a band-shaped area extending from the tapered optical waveguide 11A is covered by the mask pattern 7.

The clad layer 12, the optical waveguide layer 11, and the three layers from the cap layer 5 to the light receiving layer 3 are etched using the mask pattern 7 as an etching mask. The three layers may be etched by means of dry etching using an inductively coupled plasma of $SiC_4$ and Ar.

The area covered with the mask pattern 7 remains without being etched and thus, in this area, the tapered optical waveguide 11A, the photodiodes 10A to 10C, and the interconnecting optical waveguides 11B and 11C are formed. In the areas on both sides of this area covered with the mask pattern 7, the n-type layer 2 is exposed.

Thereafter, as shown in FIG. 5G, a clad layer 15 of Fe-doped semi-insulating InP is grown by means of MOCVD over the entire surface of the substrate. The concentration of Fe doped in the clad layer 15 is set to be $5\times10^{16}$ cm$^{-3}$. The growth of the clad layer 15 may be performed, for example, at a growth temperature of 630° C. and at a pressure of $1.33\times10^4$ Pa (100 Torr), using phosphine, trimethyl indium, ferrocene, and chloromethane as source gases.

Thereafter, as shown in FIG. 5H, the clad film 15 in an area, on the same side as the optical-to-electric converter, adjacent to the boundary between the photodiode 10A and the tapered optical waveguide 11A is dry-etched using an inductively coupled plasma such that the clad film 15 is partially etched in its thickness direction. A mixture of $SiC_4$ and Ar may be used as an etching gas.

Thereafter, as shown in FIG. 5I, the clad film 15 in an area, on the same side as the photodiode 10A, adjacent to the boundary between the photodiode 10A and the tapered optical waveguide 11A so that the upper surface of the photodiodes 10A to 10C are exposed. In this etching process, a chlorine-based etchant may be used. A contact layer 16 consisting of three layers of Au/Zn/Au is then formed by means of a lift-off method on the surface of the cap layer 5 of the exposed photodiodes 10A to 10C.

Thereafter, as shown in FIG. 5J, a mask pattern 17 of SiN is formed on the surface of the substrate so as to cover an area, on the same side as the tapered optical waveguide 11A, adjacent to the boundary between the tapered optical waveguide 11A and the first-stage photodiode 10A shown in FIG. 1B and an area including the optical-to-electric converter area in which the photodiodes 10A to 10C and the interconnecting optical waveguides 11B and 11C are disposed.

Thereafter, as shown in FIG. 5K, the clad layer 12 and the optical waveguide layer 11 are etched using the mask pattern 17 as an etching mask such that the clad film 15 in areas at both sides of the optical-to-electric converter area including the photodiodes 10A and 10C shown in FIG. 1B (areas on the upper and lower sides of FIG. 1B) is etched and thus the n-type layer 2 is exposed in those areas.

Thereafter, as shown in FIG. 5L, the n-type layer 2 in an area to the right of the right end of the etched clad layer 12 and optical waveguide layer 11 is etched so that the semiconductor substrate 1 is exposed in this area. The n-type layer 2 in areas at both sides (areas on the upper and lower sides of FIG. 1B) of the optical-to-electric converter area including the photodiodes 10A to 10C shown in FIG. 1B remains without being etched.

Thereafter, as shown in FIG. 5M, the mask pattern 17 is removed. The contact layer 30 shown in FIG. 1B is then formed by means of a lift-off technique. The contact layer has a two-layer structure composed of a AuGe layer and a Au layer disposed in this order. The coplanar electrode 31 is then formed by means of the lift-off technique. The coplanar electrode 31 has a three-layer structure composed of a Ti layer, a Pt layer, and a Au layer disposed in this order.

Thereafter, as shown in FIGS. 1A and 2, the conductive thin wire 20 and the pad 21 are formed. The conductive thin wire 20 and the pad 21 may be formed by means of, for example, a method described in paragraphs 33 to 35 with reference to FIG. 7 of Japanese Unexamined Patent Application Publication No. 2001-127333. This method is briefly described below.

First, a resist pattern is formed on the surface of a substrate such that an opening corresponding to the pad 21 is formed in the resist pattern. An underlying metal layer is then evaporated such that the surface of the resist pattern and the area inside the opening are covered with the evaporated metal layer. The underlying metal layer has a two-layer structure composed of a AuZn layer and a Au layer. The underlying metal layer is then coated with a second resist pattern such that the underlying metal layer is covered with the second resist pattern except for the area corresponding to the pad 21. Au is then plated using the underlying metal layer as a plating electrode thereby forming the pad 21 in the opening. The first-layer resist pattern and the second-layer resist patterns are then removed such that the pad 21 remains.

Thereafter, as shown in FIG. 5N, a first-layer resist film 50 is formed on the substrate. Openings corresponding to the contact layers 16 and the pad 21 are formed in the resist film 50. An underlying metal layer 51 is then evaporated such that the surface of the resist film 50 and the area in the openings are covered with the underlying metal layer 51. The underlying metal layer 51 has a two-layer structure composed of a AuZn layer and a Au layer.

A second-layer resist film 53 is then formed on the underlying metal layer 51. Openings corresponding to the conductive elements 19A to 19C and the pad 21 are formed in the resist film 53. Au is then plated using the underlying metal layer 51 as a plating electrode so that Au is embedded in the openings thereby forming the conductive elements 19A to 19C. Via this plating process, a Au film 54 with the same thickness as the conductive elements 19A to 19C is also formed on the pad 21.

Thereafter, a second-layer underlying metal layer 55 is evaporated on the resist film 53. A thirdlayer resist film 57 is then formed on the underlying metal layer 55. An opening corresponding to the conductive thin wire 20 is formed in the resist film 57. Au is then plated using the second-layer underlying metal layer 55 as a plating electrode so as to form the conductive thin wire 20.

The third-layer resist film 57 is then removed. The second-layer resist film 53 is then removed together with the second-layer underlying metal layer 55 on the second-layer resist film 53. Furthermore, the first-layer resist film 50 is removed together with the first-layer underlying metal layer 51 on the first-layer resist film 50. The conductive elements 19A to 19C and the conductive thin wire 20 remain without being removed.

Figure 6:
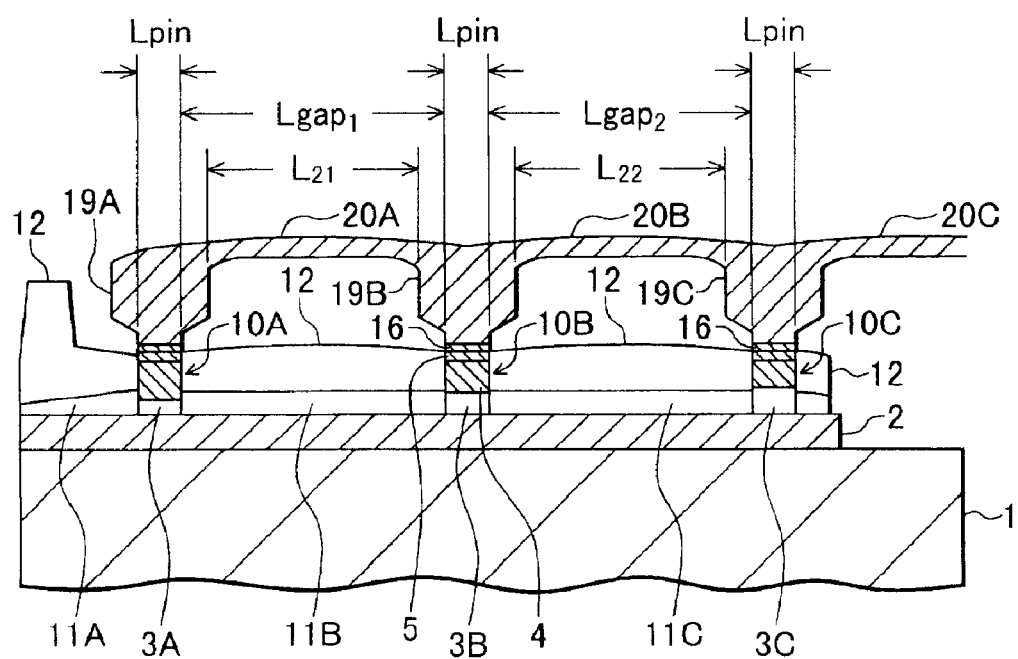
FIG. 6 is a crosssectional view of an optical-to-electric converter of a semiconductor light receiving device according to a second embodiment.
Figure 7:
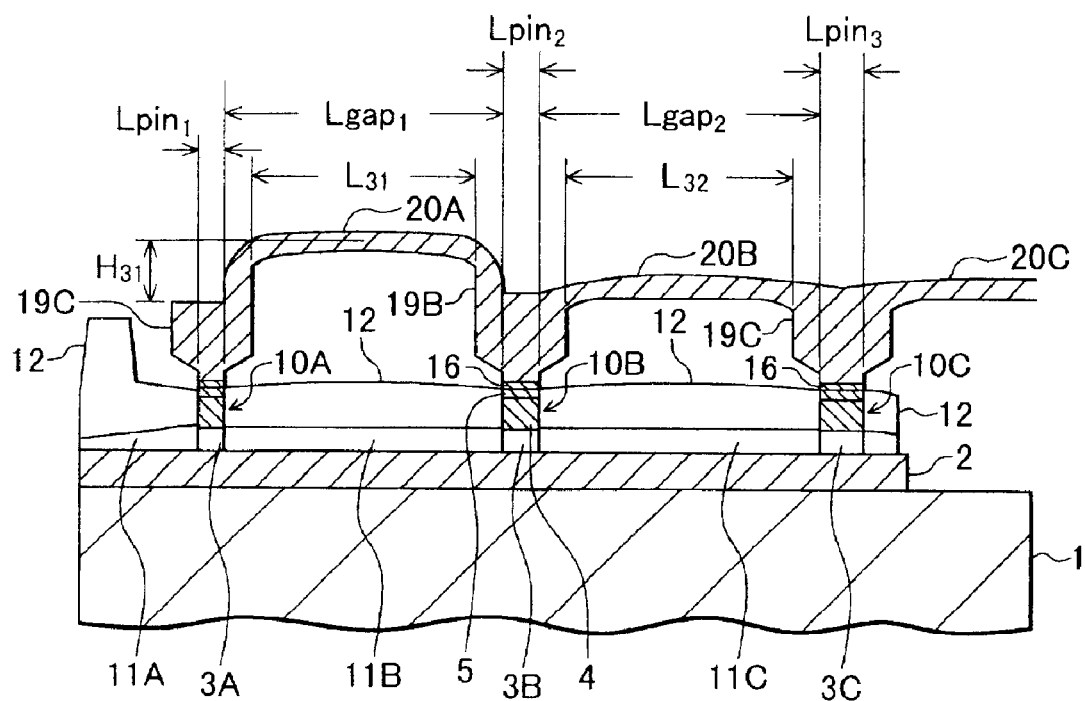
FIG. 7 is a cross-sectional view of an optical-to-electric converter of a semiconductor light receiving device according to a third embodiment.
Figure 8:
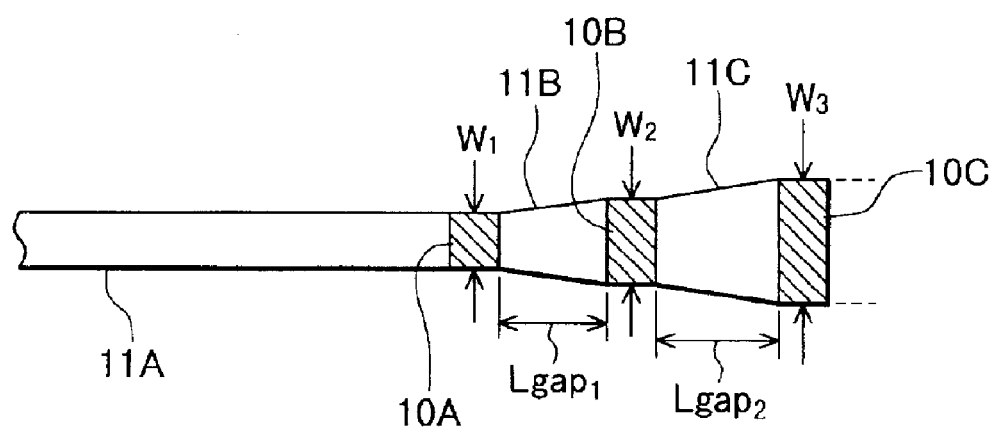
FIG. 8 is a plan view of an optical-to-electric converter of a semiconductor light receiving device according to a fourth embodiment.

Now, referring to FIGS. 6 to 8, semiconductor light receiving devices according to second to fourth embodiments are described. In the above-described semiconductor light receiving device according to the first embodiment, a greatest photocurrent passes through the first-stage photodiode 10A, and the photocurrents passing through photodiodes decrease in a direction toward the last stage.

However, if a large photocurrent flows through a small area of a light receiving layer, a space-charge effect can cause a reduction in the response speed. In the second to fourth embodiments described below, an excess photocurrent that can cause such a problem is prevented.

FIG. 6 is a cross-sectional view of an optical-to-electric converter of a semiconductor light receiving device according to a second embodiment. The thicknesses of light receiving layers 3A to 3C of photodiodes 10A to 10C at the first to third stages are respectively set to 0.1 $\mu$m, 0.15 $\mu$m, and 0.2 $\mu$m. That is, the light receiving layer thickness decreases in a direction from the last stage to the first stage. This means that an optical signal traveling through the light receiving layers encounters a gradual reduction in thickness of the light receiving layer. The reduction in the thickness of the light receiving layer results in a reduction in refinement of light and thus a reduction in absorption of light.

As in the first embodiment, the width of each photodiode 10A to 10C is set to 4 $\mu$m and the length $L_{pin}$ is set to 3 $\mu$m. The space $L_{gap1}$ between the first-stage photodiode 10A and the second-stage photodiode 10B is set to 64 $\mu$m, and the space $L_{gap2}$ between the second-stage photodiode 10B and the third-stage photodiode 10C is set to 47 $\mu$m. The length $L_{21}$ of the conductive thin wire 20A connecting the first-stage photodiode 10A and the second-stage photodiode 10B with each other is set to 54 $\mu$m, and the length $L_{22}$ of the conductive thin wire 20B connecting the second-stage photodiode 10B and the third-stage photodiode 10C with each other is set to 47 $\mu$m, The width and the thickness of the conductive thin wires 20A and 20B are set to values equal to those employed in the first embodiment.

With varying thickness of the light receiving layer 3, the capacitance C in the equivalent circuit shown in FIG. 3 varies. The length of the conductive thin wire 20 and the space between adjacent photodiodes 10 are adjusted so that equations (2) and (5) are satisfied regardless of the variation in capacitance C.

Because the thickness of the light receiving layer is smallest at the first stage and increases toward the last stage, the absorption of light is averaged, and thus an excess photocurrent is prevented from flowing through some photodiode.

A method of producing the semiconductor light receiving device according to the second embodiment is described below. In the process of producing the semiconductor light receiving device according to the first embodiment described earlier, the light receiving layer 3 is grown over the entire surface until the thickness becomes equal to the thickness of the light receiving layer 3A of the first-stage photodiode 10A, which is the smallest in thickness of all photodiodes. Thereafter, an area in which the first-stage photodiode 10A is to be formed is covered with a mask formed of $SiO_2$ or the like, and a light receiving layer is further grown by a thickness equal to the difference between the thickness of the light receiving layer 3A of the first-stage photodiode 10A and the thickness of the light receiving layer 3B of the second-stage photodiode 10B. Thereafter, the area in which the firststage photodiode 10A is to be formed and an area in which the second-stage photodiode 10B is to be formed are covered with a mask, and a light receiving layer is further grown by a thickness equal to the difference between the thickness of the light receiving layer 3B of the second-stage photodiode 10B and the thickness of the light receiving layer 3C of the third-stage photodiode 10C. Steps after that are similar to those of the process of producing the semiconductor light receiving device according to the first embodiment.

FIG. 7 is a cross-sectional view of an optical-to-electric converter of a semiconductor light receiving device according to a third embodiment. The lengths $L_{pin1}$ to $L_{pin3}$ of the photodiodes 10A to 10C at the first to third stages are respectively set to 1.5 µm, 2.0 µm, and 3.0 µm. That is, the length of the photodiode increases in a direction in which an optical signal propagates. This means that the length of the light receiving layer is smallest at the first stage and increases in a direction toward the last stage. The absorption of light decreases with decreasing length of the light receiving layer.

The width of each photodiode 10A to 10C is set to 4 µm as in the first embodiment, and the thickness of each light receiving layer 3A to 3C is set to 0.15 µm. The space $L_{gap1}$ between the first-stage photodiode 10A and the second-stage photodiode 10B is set to 23 µm, and the space $L_{gap2}$ between the second-stage photodiode 10B and the third-stage photodiode 10C is set to 41 µm.

The conductive thin wire 20A connecting the first-stage photodiode 10A and the second-stage photodiode 10B with each other is formed so as to rise up by a height of $H_{31}$ at points where the conductive thin wire 20A joins with the photodiodes 10A and 10B. The longitudinal length $L_{31}$ of the conductive thin wire 20A is set to be 20 µm, and the vertical length $H_{31}$ of the rising portions is set to be 5 µm. Thus, the total length of the conductive thin wire 20A is 30 µm. The length $L_{32}$ of the conductive thin wire 20B connecting the second-stage photodiode 10B and the third-stage photodiode 10C with each other is set to be 39 µm. The width and the thickness of each of conductive thin wires 20A and 20B are the same as those in the first embodiment.

With varying length of the light receiving layer 3, the capacitance C in the equivalent circuit shown in FIG. 3 varies. The length of the conductive thin wire 20 and the space between adjacent photodiodes 10 are adjusted so that equations (2) and (5) are satisfied regardless of the variation in capacitance C.

Because the length of the light receiving layer is smallest at the first stage and increases toward the last stage, the absorption of light is averaged, and thus an excess photocurrent is prevented from flowing through some photodiode.

A method of producing the semiconductor light receiving device according to the second embodiment is described below. Parts other than the conductive thin wire are produced via steps that are similar to those of the method of producing the semiconductor light receiving device according to the first embodiment described above. The conductive thin wire 20A rising up at joining points with the photodiodes 10A and 10B may be produced by disposing, before performing a Au plating process, an additional resist pattern with a thickness of $H_{31}$ in an area where the conductive thin wire 20A is to be formed.

FIG. 8 is a plan view of an opticaltoelectric converter of a semiconductor light receiving device according to the embodiment. The width $W_1$ of the first-stage photodiode 10A is set to 3 µm, the width $W_2$ of the second-stage photodiode 10B to 5 µm, and the width $W_3$ of the third-stage photodiode 10C to 10 µm. The space $L_{gap1}$ between the first-stage photodiode 10A and the second-stage photodiode 10B is set to 15 µm, and the space $L_{gap2}$ between the second-stage photodiode 10B and the third-stage photodiode 10C is set to 20 µm.

The width of the interconnecting optical waveguide 11B and 11C connecting adjacent photodiodes with each other gradually increases in the direction toward the last stage so as to achieve matching with the width of the photodiodes 10A to 10C. The other parts are formed in a similar manner as in the semiconductor light receiving device according to the first embodiment.

Because the width of the light receiving layer is smallest at the first stage and increases toward the last stage, the absorption of light is averaged, and thus an excess photocurrent is prevented from flowing through some photodiode.

Figure 9:
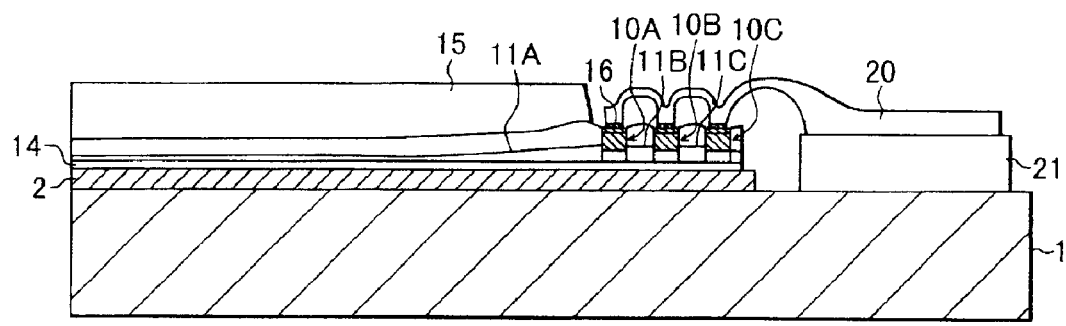
FIG. 9 is a cross-sectional view of a semiconductor light receiving device according to a fifth embodiment.
Figure 10A:
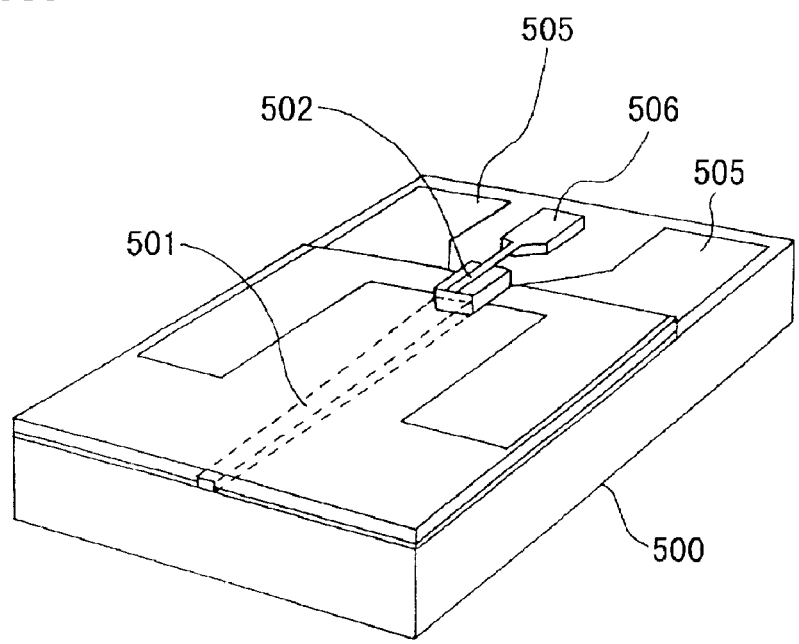
FIG. 10A is a perspective view of a semiconductor light receiving device according to a first conventional technique.
Figure 10B:
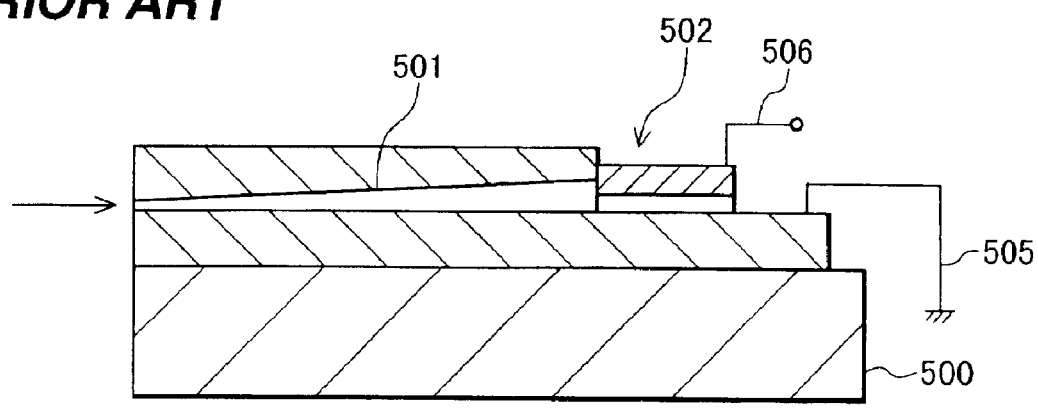
FIG. 10B is a cross-sectional view thereof.
Figure 11A:
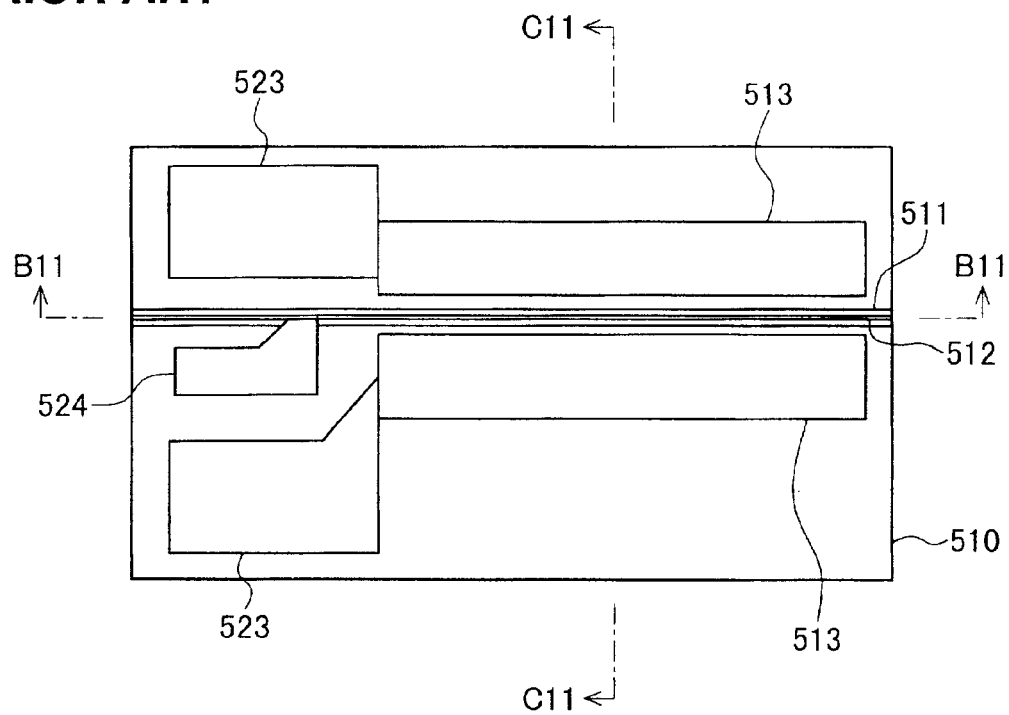
FIG. 11A is a plan view of a semiconductor light receiving device according to a second conventional technique.
Figure 11B:
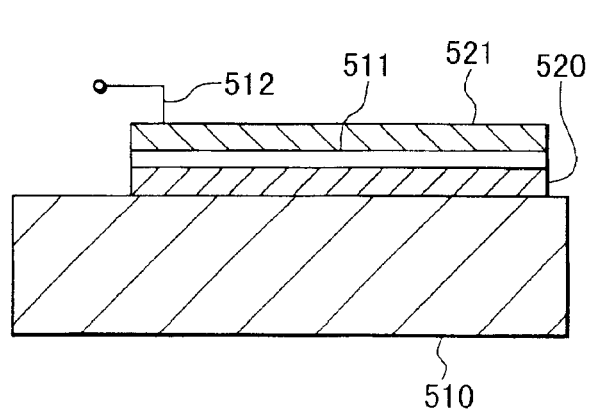
FIGS. 11B and 11C are cross-sectional views thereof.
Figure 11C:
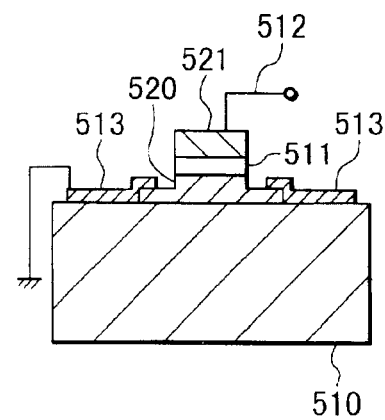
Figure 12A:
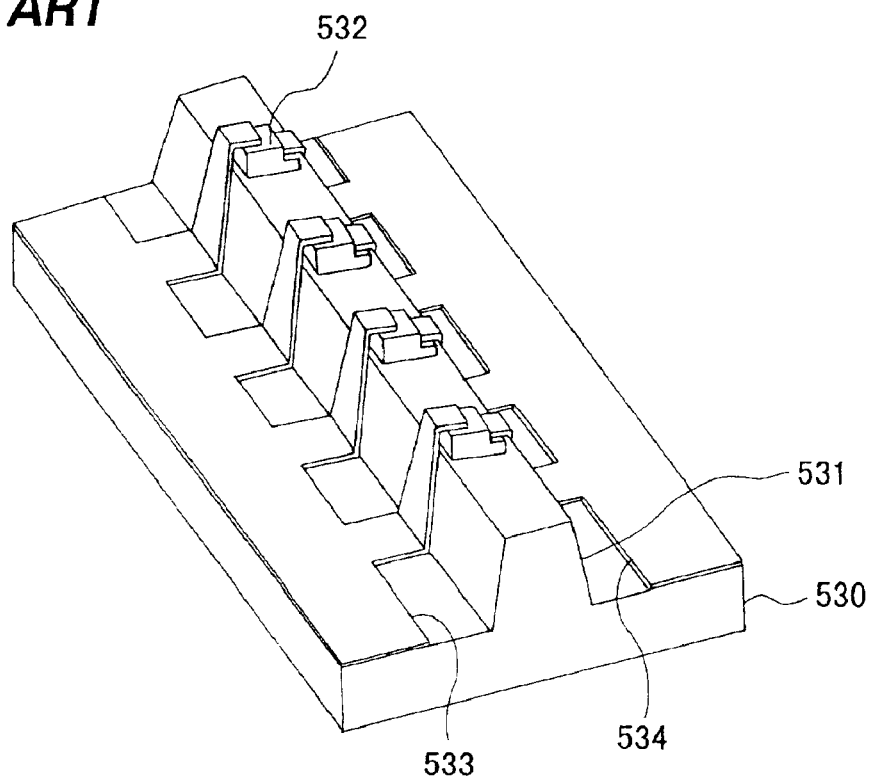
FIG. 12A is a perspective view of a semiconductor light receiving device according to a third conventional technique.
Figure 12B:
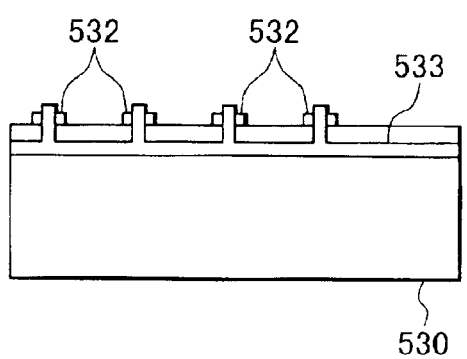
FIG. 12B is a side view thereof.
Figure 12C:
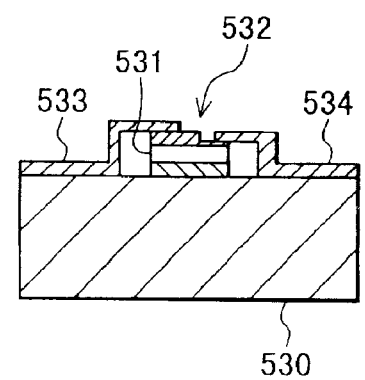
FIG. 12C is a cross-sectional view thereof.
Figure 13A:
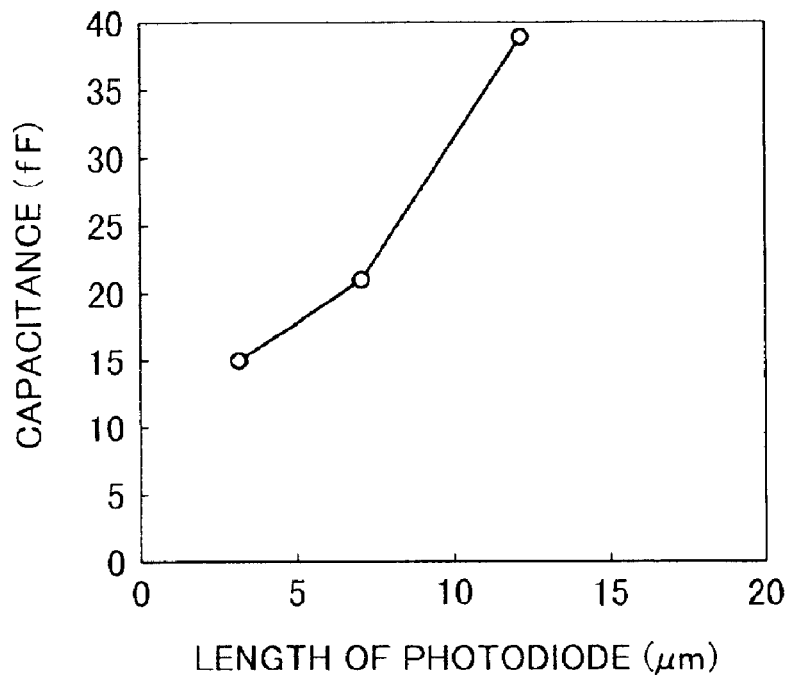
FIG. 13A is a graph showing the dependence of the capacitance of a photodiode on its length.
Figure 13B:
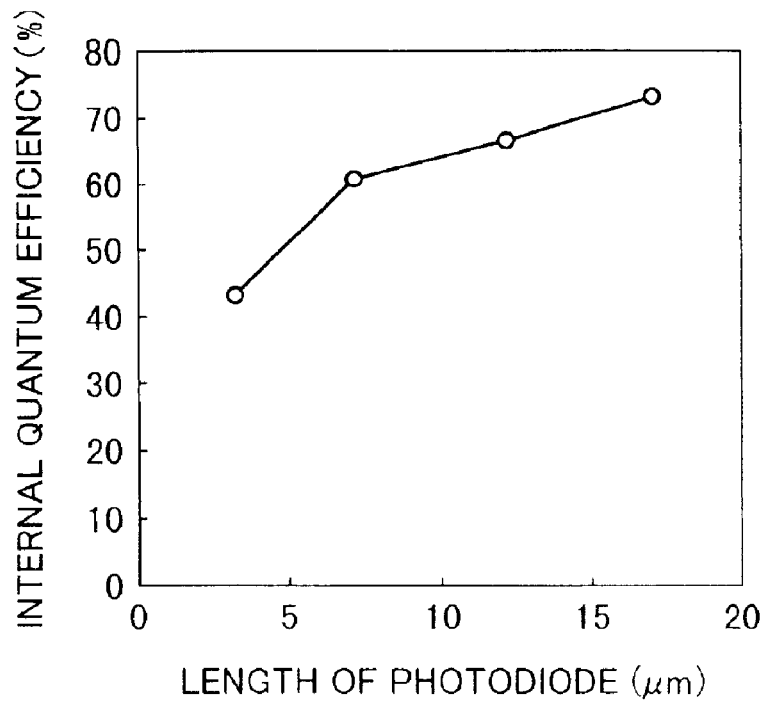
FIG. 13B is a graph showing the dependence of the internal quantum efficiency of a photodiode on its length.

Referring to FIG. 9, a semiconductor light receiving device according to a fifth embodiment is described below.

FIG. 9 is a cross-sectional view of the semiconductor light receiving device according to the fifth embodiment. In the first embodiment described earlier, as shown in FIG. 1A, the optical waveguides 11A to 11C and the light receiving layer 3 are directly formed on the n-type layer 2. In this fifth embodiment, unlike the first embodiment, a lower optical waveguide 14 is formed on the n-type layer 2, and the optical waveguides 11A to 11C and the light receiving layer 3 are formed on the lower optical waveguide 14. The other parts are formed in a similar manner as in the first embodiment The lower optical waveguide 14 may be formed of n-type InP.

Use of the lower optical waveguide 14 allows a reduction in loss at a butt-coupling point between the optical waveguide and the light receiving layer.

In the first to fifth embodiments described above, three photodiodes 10A to 10C are used. Alternatively, two photodiodes or four or more photodiodes may be used. Furthermore, although in the first to fifth embodiments described above, the conductive thin wire 20 is formed so as to extend in the air, the conductive thin wire 20 may be formed so as to extend on the surface of an insulating film formed on the substrate.

The present invention has been described above with reference to specific embodiments. Note that the present invention is not limited to those specific embodiments. It should be obvious to those skilled in the art that various changes, modifications, and improvements may be made without departing from the spirit and scope of the present invention.

What is claimed is:

1. A semiconductor light receiving device comprising:
   a plurality of semiconductor devices, which are disposed in a line on a surface of a supporting substrate and each of which is adapted to generate an electric signal depending on the intensity of incident light;
   an interconnecting optical waveguide formed such that the plurality of semiconductor devices are coupled by the interconnecting optical waveguide from one semiconductor device to an adjacent one so as to allow light to pass through the semiconductor devices from one semiconductor device to an adjacent one in a direction from a first stage toward a last stage; and
   an electric signal transmission line formed by a pair of conductors connected to the semiconductor devices, for transmitting an electric signal generated by the semiconductor devices, a first conductor of the pair of conductors extending in air above the supporting substrate between adjacent semiconductor devices, a second conductor of the electric signal transmission line being formed so as to be in direct contact with the surface of the supporting substrate, with air being disposed between the first conductor and the supporting substrate.

2. A semiconductor light receiving device according to claim 1, wherein the propagation velocity of light traveling through the interconnecting optical waveguide and the semiconductor device in a direction from the first stage to the last stage is matched with the propagation velocity of an electric signal traveling along the electric signal transmission line.

3. A semiconductor light receiving device according to claim 1, wherein each of the semiconductor devices and interconnecting optical waveguide is butt-coupled with each other.

4. A semiconductor light receiving device according to claim 1, wherein each semiconductor device is a pin photodiode including a p-type region, an n-type region and a light receiving region disposed between the p-type region and the n-type region;
the second conductor is formed so as to define an upper flat surface, and the second conductor of the electric signal transmission line also serves as one of p-type and n-type regions of the semiconductor device; and
the interconnecting optical waveguide and a light receiving region of the semiconductor device are disposed above the upper surface of the second conductor.

5. A semiconductor light receiving device according to claim 1, wherein each semiconductor device is a pin photodiode including a p-type region, an n-type region and a light receiving region disposed between the p-type region and the n-type region;
the second conductor of the electric signal transmission line is formed so as to define an upper flat surface, and the second conductor of the electric signal transmission line also serves as one of p-type and n-type regions of the semiconductor device;
the semiconductor light receiving device further comprises a lower optical waveguide consisting of a semiconductor having a same conduction type as that of the second conductor and disposed on the surface of the second conductor; and
the interconnecting optical waveguide and the light receiving region of the semiconductor device are disposed on the lower optical waveguide.

6. A semiconductor light receiving device according to claim 1, further comprising an input optical waveguide optically coupled with a semiconductor device, of the plurality of semiconductor devices, located at the first stage closest to the input end, wherein the thickness of the input optical waveguide gradually increases toward the semiconductor device optically coupled with the input optical waveguide.

7. A semiconductor light receiving device according to claim 1, wherein the second conductor of the electric transmission line is disposed above the interconnecting optical waveguide between adjacent semiconductor devices.

8. A semiconductor light receiving device comprising:
a plurality of semiconductor devices, which are disposed in a line on a surface of a supporting substrate and each of which is adapted to generate an electric signal depending on the intensity of incident light, each of the semiconductor devices comprising a p-type region, an n-type region, and a light receiving region disposed between the p-type region and the n-type region;
an interconnecting optical waveguide formed such that the plurality of semiconductor devices are optically coupled by the interconnecting optical waveguide from one semiconductor device to an adjacent one thereby allowing light to pass through the light receiving regions of the plurality of semiconductor devices from one semiconductor device to an adjacent one in a direction from a first stage toward a last stage; and
an electric signal transmission line consisting of a pair of conductors connected to the semiconductor devices, for transmitting an electric signal generated by the semiconductor devices,
wherein the thickness of the light receiving region of the semiconductor device is greatest at the last stage and decreases in a direction from the last stage toward the first stage.

9. A semiconductor light receiving device according to claim 8, wherein the propagation velocity of light propagating through the interconnecting optical waveguide and the semiconductor devices in a direction from the first stage toward the last stages is matched with the propagation velocity of an electric signal propagating along the electric signal transmission line.

10. The semiconductor light receiving device of claim 8, wherein the pair of conductors includes a first conductor extending through air and being spaced apart from the supporting substrate.

11. A semiconductor light receiving device comprising:
a plurality of semiconductor devices, which are disposed in a line on a surface of a supporting substrate and each of which is adapted to generate an electric signal depending on the intensity of incident light, each of the semiconductor devices comprising a p-type region, an n-type region, and a light receiving region disposed between the p-type region and the n-type region;
an interconnecting optical waveguide formed such that the plurality of semiconductor devices are optically coupled by the interconnecting optical waveguide from one semiconductor device to an adjacent one thereby allowing light to pass through the light receiving regions of the plurality of semiconductor devices from one semiconductor device to an adjacent one in a direction from a first stage toward a last stage; and
an electric signal transmission line consisting of a pair of conductors connected to the semiconductor devices, for transmitting an electric signal generated by the semiconductor devices,
wherein the length of the light receiving region of the semiconductor device is greatest at the last stage and decreases in a direction from the last stage toward the first stage, and
wherein the pair of conductors includes a first conductor extending through air and being spaced apart from the supporting substrate, a second conductor of the electric signal transmission line being formed so as to be in direct contact with the surface of the supporting substrate, with air being disposed between the first conductor and the supporting substrate.

12. A semiconductor light receiving device according to claim 11, wherein the propagation velocity of light traveling through the interconnecting optical waveguide and the semiconductor device in a direction from the first stage to the last stage is matched with the propagation velocity of an electric signal traveling along the electric signal transmission line.

13. A semiconductor light receiving device according to claim 11, wherein the second conductor of the electric transmission line is disposed above the interconnecting optical waveguide between adjacent semiconductor devices.

14. A semiconductor light receiving device comprising:
a plurality of semiconductor devices, which are disposed in a line on a surface of a supporting substrate and each of which is adapted to generate an electric signal depending on the intensity of incident light, each of the semiconductor devices comprising a p-type region, an n-type region, and a light receiving region disposed between the p-type region and the n-type region;
an interconnecting optical waveguide formed such that the plurality of semiconductor devices are optically coupled by the interconnecting optical waveguide from one semiconductor device to an adjacent one thereby allowing light to pass through the light receiving regions of the plurality of semiconductor devices from one semiconductor device to an adjacent one in a direction from a first stage toward a last stage; and an electric signal transmission line consisting of a pair of conductors connected to the semiconductor devices, for transmitting an electric signal generated by the semiconductor devices, wherein the width of the light receiving region of semiconductor devices is greatest at the last stage and decreases in a direction toward the first stage, wherein the pair of conductors includes a first conductor extending through air and being spaced apart from the supporting substrate, and includes a second conductor of the electric signal transmission line being formed so as to be in direct contact with the surface of the supporting substrate.

15. A semiconductor light receiving device according to claim 14, wherein the propagation velocity of light traveling through the interconnecting optical waveguide and the semiconductor device in a direction from the first stage to the last stage is matched with the propagation velocity of an electric signal traveling along the electric signal transmission line.

16. A semiconductor light receiving device according to claim 14, wherein the second conductor of the electric transmission line is disposed above the interconnecting optical waveguide between adjacent semiconductor devices.

17. A semiconductor light receiving device comprising:

a first conductive layer formed of a semiconductor having a first conduction type on the surface of a supporting substrate;

a plurality of multilayer structures disposed in a line on the surface of the first conductive layer, each multilayer structure including a light receiving layer and a second conductive layer formed of a semiconductor having a second conduction type opposite to the first conduction type, each multilayer structure being adapted to generate an electric signal between the first conductive layer and the second conductive layer in response to an optical signal incident on the light receiving layer;

an interconnecting optical waveguide disposed on the first conductive layer so as to optically connect light receiving layers of adjacent multilayer structures with each other; and a conductive thin wire disposed so as to connect the second conductive layers of the multilayer structures from one to another thereby allowing the generated electric signal to be transmitted, wherein the conductive thin wire extends through air and is spaced apart from the supporting substrate, with air being disposed between the conductive thin wire and the supporting substrate.

18. A semiconductor light receiving device according to claim 17, further comprising a lower optical waveguide having the same conduction type as that of the first conductive layer and formed on the first conductive layer, wherein the interconnecting optical waveguide and the multilayer structures are disposed on the lower optical waveguide.

19. A semiconductor light receiving device according to claim 17, wherein the conductive thin wire is disposed above the interconnecting optical waveguide between adjacent multilayer structures.

20. A semiconductor light receiving device comprising:

a plurality of semiconductor devices, which are disposed in a line on a surface of a supporting substrate and each of which is adapted to generate an electric signal depending on the intensity of incident light;

an interconnecting optical waveguide formed such that the plurality of semiconductor devices are coupled by the interconnecting optical waveguide from one semiconductor device to an adjacent one so as to allow light to pass through the semiconductor devices from one semiconductor device to an adjacent one in a direction from a first stage toward a last stage, the interconnecting optical waveguide being butt-coupled with the semiconductor devices; and an electric signal transmission line formed by a pair of conductors connected to the semiconductor devices, for transmitting an electric signal generated by the semiconductor devices, wherein the pair of conductors includes a first conductor extending through air and being spaced apart from the supporting substrate, and includes a second conductor of the electric signal transmission line being formed so as to be in direct contact with the surface of the supporting substrate, with air being disposed between the first conductor and the supporting substrate.

21. A semiconductor light receiving device according to claim 20, wherein the second conductor of the electric transmission line is disposed above the interconnecting optical waveguide between adjacent semiconductor devices.

* * * * *